(12) United States Patent
Liu et al.

(10) Patent No.: US 10,585,314 B2
(45) Date of Patent: Mar. 10, 2020

(54) ARRAY SUBSTRATE, LIQUID CRYSTAL DISPLAY PANEL AND DISPLAY APPARATUS

(71) Applicants: BOE Technology Group Co., Ltd., Beijing (CN); Beijing BOE Display Technology Co., Ltd., Beijing (CN)

(72) Inventors: Xiaona Liu, Beijing (CN); Feng Li, Beijing (CN); Liang Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/919,363

(22) Filed: Mar. 13, 2018

(65) Prior Publication Data

US 2019/0129258 A1    May 2, 2019

(30) Foreign Application Priority Data

Oct. 27, 2017   (CN) .......................... 2017 1 1022303

(51) Int. Cl.
| | |
|---|---|
| G02F 1/1343 | (2006.01) |
| G02F 1/1333 | (2006.01) |
| G02F 1/1362 | (2006.01) |
| G06F 3/041 | (2006.01) |
| H01L 27/12 | (2006.01) |
| G02F 1/1368 | (2006.01) |

(52) U.S. Cl.
CPC ...... *G02F 1/134309* (2013.01); *G02F 1/1368* (2013.01); *G02F 1/13338* (2013.01); *G02F 1/136286* (2013.01); *G06F 3/0412* (2013.01); *G06F 3/04164* (2019.05); *H01L 27/12* (2013.01); *G02F 2001/134354* (2013.01); *G02F 2201/123* (2013.01)

(58) Field of Classification Search
CPC . G02F 1/13338; G02F 1/136286; G06F 3/012
See application file for complete search history.

(56) References Cited

U.S. PATENT DOCUMENTS

| | | | | |
|---|---|---|---|---|
| 5,677,744 A | * | 10/1997 | Yoneda | G02F 1/13338 345/104 |
| 9,274,636 B2 | * | 3/2016 | Xu | G02F 1/13338 |
| 9,293,481 B2 | * | 3/2016 | Wu | G02F 1/134309 |

(Continued)

*Primary Examiner* — James A Dudek
(74) *Attorney, Agent, or Firm* — Westman, Champlin & Koehler, P.A.

(57) ABSTRACT

The present disclosure relates to an array substrate, a liquid crystal display panel, and a display apparatus. In an embodiment, an array substrate includes: a plurality of pixel electrodes arranged in an array, data signal lines each connected to a corresponding one of the pixel electrodes, and touch control signal lines extending in a same direction as the data signal lines. Every two ones of the pixel electrodes adjacent to each other in a row direction constitute an electrode set. Each of the data signal lines is located in a gap between two adjacent electrode sets in a column direction, and the touch control signal lines are each disposed between one of the data signal lines and either of two adjacent electrode sets located adjacent to the one data signal line in the row direction.

14 Claims, 6 Drawing Sheets

(56) References Cited

U.S. PATENT DOCUMENTS

| | | | |
|---|---|---|---|
| 9,360,979 B2* | 6/2016 | Liu | G06F 3/044 |
| 9,429,780 B2* | 8/2016 | Jo | G02F 1/134363 |
| 9,678,377 B2* | 6/2017 | Zhou | G06F 3/044 |
| 9,836,174 B2* | 12/2017 | Zhou | G06F 3/044 |
| 10,203,530 B1* | 2/2019 | Xu | G02F 1/13306 |
| 2003/0156087 A1* | 8/2003 | Boer | G02F 1/13338 345/92 |
| 2006/0097976 A1* | 5/2006 | Lee | G06F 3/0412 345/98 |
| 2007/0109239 A1* | 5/2007 | den Boer | G02F 1/13338 345/87 |
| 2008/0180400 A1* | 7/2008 | Kim | G06F 3/0412 345/173 |
| 2009/0040408 A1* | 2/2009 | Ishii | G02F 1/136213 349/39 |
| 2009/0115735 A1* | 5/2009 | Chuang | G02F 1/13338 345/173 |
| 2009/0174681 A1* | 7/2009 | Chang | G06F 3/0412 345/173 |
| 2009/0231511 A1* | 9/2009 | Takahashi | G02F 1/13338 349/61 |
| 2009/0289912 A1* | 11/2009 | Chen | G06F 3/0412 345/173 |
| 2010/0315377 A1* | 12/2010 | Chang | G06F 3/0386 345/175 |
| 2011/0115691 A1* | 5/2011 | Liu | G02F 1/136286 345/55 |
| 2011/0221738 A1* | 9/2011 | Murai | G06F 3/0412 345/212 |
| 2011/0310035 A1* | 12/2011 | Kim | G06F 3/0412 345/173 |
| 2012/0154308 A1* | 6/2012 | Jeon | G02F 1/13338 345/173 |
| 2012/0188190 A1* | 7/2012 | Lee | G02F 1/13338 345/173 |
| 2014/0111473 A1* | 4/2014 | Yang | G06F 3/044 345/174 |
| 2014/0125626 A1* | 5/2014 | Yang | G02F 1/134336 345/174 |
| 2014/0168552 A1* | 6/2014 | Jo | G02F 1/134363 349/33 |
| 2015/0185930 A1* | 7/2015 | Xu | G06F 3/0412 345/173 |
| 2015/0205156 A1* | 7/2015 | Xu | G02F 1/13338 349/12 |
| 2015/0268774 A1* | 9/2015 | Xu | G02F 1/13338 345/173 |
| 2015/0378471 A1* | 12/2015 | Liu | G06F 3/044 345/174 |
| 2016/0041415 A1* | 2/2016 | Lin | G02F 1/13338 345/173 |
| 2016/0253010 A1* | 9/2016 | Xu | G02F 1/13338 349/12 |
| 2016/0299614 A1* | 10/2016 | Yang | G06F 3/044 |
| 2017/0038887 A1* | 2/2017 | Zhang | G02F 1/136227 |
| 2017/0084668 A1* | 3/2017 | Wang | H01L 27/32 |
| 2017/0205934 A1* | 7/2017 | Lee | G02F 1/136286 |
| 2017/0212623 A1* | 7/2017 | Park | G02F 1/133345 |
| 2017/0220148 A1* | 8/2017 | Zhou | G06F 3/044 |
| 2017/0242533 A1* | 8/2017 | Liu | G06K 9/00013 |

* cited by examiner

ARRAY SUBSTRATE, LIQUID CRYSTAL DISPLAY PANEL AND DISPLAY APPARATUS

CROSS-REFERENCE TO RELATED APPLICATION

This application claims priority to Chinese Patent Application No. 201711022303.3 filed on Oct. 27, 2017 in the State Intellectual Property Office of China, the disclosure of which is hereby incorporated by reference in its entirety.

BACKGROUND

1. Technical Field

The present disclosure relates to the field of display technology, and particularly to an array substrate, a liquid crystal display panel, and a display apparatus.

2. Description of the Related Art

At present, touch control technology is more and more widely used in display products, especially in products of medium and small sizes. Addition of touch control components inside a display product can save cost and increase production capacity, and thus has great application space.

SUMMARY

According to an aspect of the present disclosure, there is provided an array substrate, comprising: a plurality of pixel electrodes arranged in an array, data signal lines each connected to a corresponding one of the pixel electrodes, and touch control signal lines extending in a same direction as the data signal lines; wherein:

every two ones of the pixel electrodes adjacent to each other in a row direction constitute an electrode set, each of the data signal lines is located in a gap between two adjacent electrode sets in a column direction, and the touch control signal lines are each disposed between one of the data signal lines and either of two electrode sets located adjacent to the one data signal line in the row direction.

In some embodiments, distances between the data signal lines and the pixel electrodes respectively connected to the data signal lines are equal to one another.

In some embodiments, one, where the data signal line is disposed, of the gaps between the adjacent pixel electrodes in the column direction has a greater width than that of other one, where no data signal line is disposed, of the gaps between the adjacent pixel electrodes in the column direction.

In some embodiments, the adjacent pixel electrodes in the column direction are staggered one another by a distance that is equal to a factor "X" multiplied by a width of the pixel electrode and the factor "X" is larger than zero and less than one.

In some embodiments, the data signal lines and the touch control signal lines extend in a straight line manner along the gaps between the electrode sets.

In some embodiments, the data signal lines and the touch control signal lines extend in a zigzag manner along the gaps between the electrode sets.

In some embodiments, the data signal line and the touch control signal line are located in different layers of films, respectively.

In some embodiments, each of the data signal lines is connected to the pixel electrodes located in a same column.

In some embodiments, the array substrate has a single-gate structure, and the data signal lines are in a one-to-one correspondence with the touch control signal lines.

In some other embodiments, the array substrate has a dual-gate structure, and each of the data signal lines is connected to two columns of pixel electrodes adjacent to the each data signal line, respectively.

In some embodiments, each of the data signal lines corresponds to two of the touch control signal lines, respectively.

According to another aspect of the present disclosure, there is provided a liquid crystal display panel comprising the array substrate of any one of the abovementioned embodiments.

In some embodiments, in the array substrate, distances between the data signal lines and the pixel electrodes respectively connected to the data signal lines are equal to one another.

In some embodiments, in the array substrate, one, where the data signal line is disposed, of the gaps between the adjacent pixel electrodes in the column direction has a greater width than that of other one, where no data signal line is disposed, of the gaps between the adjacent pixel electrodes in the column direction.

In some embodiments, in the array substrate, the adjacent pixel electrodes in the column direction are staggered one another by a distance that is equal to a factor "X" multiplied by a width of the pixel electrode and the factor "X" is larger than zero and less than one.

In some embodiments, in the array substrate, the data signal lines and the touch control signal lines extend in a straight line manner along the gaps between the electrode sets.

In some embodiments, in the array substrate, the data signal lines and the touch control signal lines extend in a zigzag manner along the gaps between the electrode sets.

In some embodiments, each of data signal lines is connected to the pixel electrodes in a same column; and the array substrate has a single-gate structure, and the data signal lines are in a one-to-one correspondence with the touch control signal lines.

In some other embodiments, the array substrate has a dual-gate structure, each of the data signal lines is connected to two columns of pixel electrodes adjacent to the each data signal line, respectively, and each of the data signal lines corresponds to two of the touch control signal lines, respectively.

According to yet another aspect of the present disclosure, there is provided a display apparatus comprising the liquid crystal display panel of any one of the abovementioned embodiments.

DETAILED DESCRIPTION OF THE EMBODIMENTS

Solutions of an array substrate, a liquid crystal display panel and a display apparatus according to embodiments of the present disclosure will be described hereinafter in detail in conjunction with the embodiments and with reference to the attached drawings.

Shapes and sizes of these components/elements shown in the attached drawings do not reflect real proportion of the array substrate, but are intended only to illustrate the contents of this disclosure.

Figure 1:
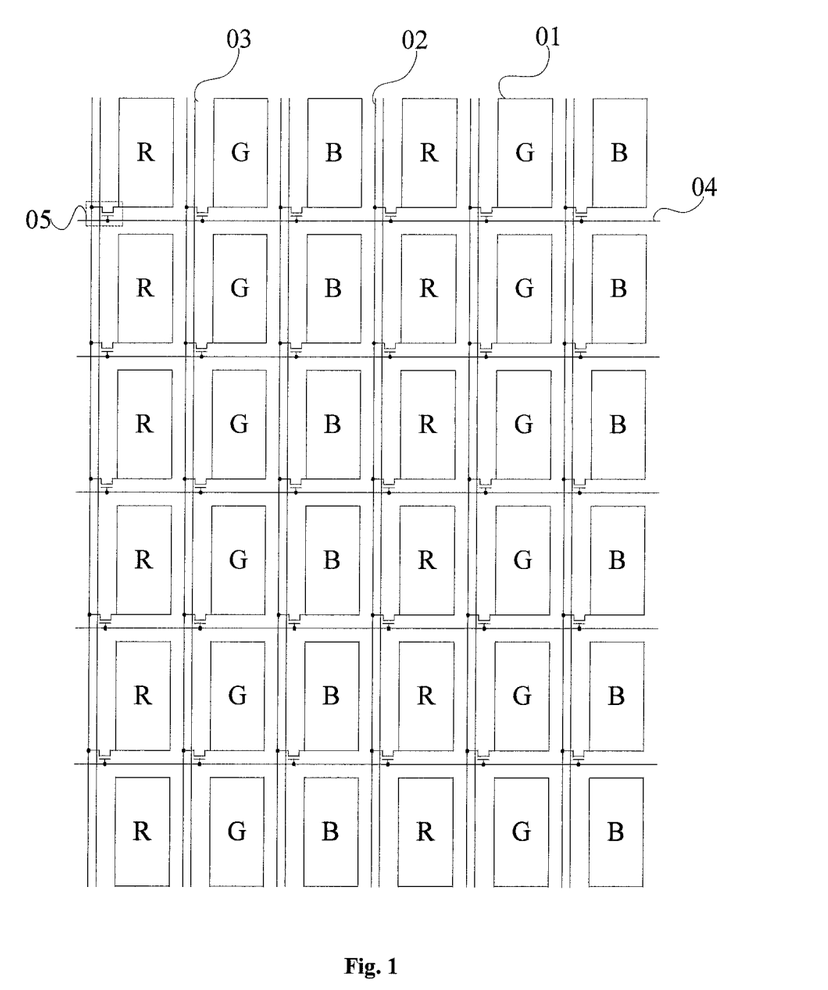
FIG. 1 is a schematic diagram showing a structure of an array substrate.

As shown in FIG. 1, generally, pixel regions are bounded by data signal lines 02 and gate lines 04 crossing the data signal lines in an array substrate of a touch control display product. Pixel electrodes 01 are disposed in the pixel regions. The data signal lines 02 load data signals to the pixel electrodes 01 through switching transistors 05. Generally, touch control signal lines 03 are additionally disposed alongside the data signal lines 02, and the data signal lines 02 and the touch control signal lines 03 are fabricated from the same film. As shown in FIG. 1, it can be seen that the data signal line 02 connected to one of adjacent pixel electrodes 01 is close to the other of the adjacent pixel electrodes 01, so that a coupling capacitance $C_{pd}$ between the other of the adjacent pixel electrodes 01 and the data signal line 02 is large, easily resulting in a poor picture display and thus adversely affecting picture display quality.

Accordingly, embodiments of the present disclosure provide an array substrate. As shown in FIG. 2 to FIG. 6, the array substrate comprises: a plurality of pixel electrodes 01 arranged in an array, data signal lines 02 each connected to a corresponding one of the pixel electrodes 01, and touch control signal lines 03 extending in the same direction as the data signal lines 02.

Every two ones of the pixel electrodes 01 adjacent to each other in a row direction constitute an electrode set 011. The data signal lines 02 are located in gaps between the adjacent electrode sets 011 in a column direction, and the touch control signal line 03 is disposed between each of two adjacent electrode sets 011 and the data signal line 02 located between the two adjacent electrode sets 011 in the row direction.

Specifically, in the array substrate according to the embodiments of the present disclosure, the touch control signal line 03 is disposed between the data signal line 02 and the pixel electrode 01 located on either side of the data signal line 02. Accordingly, it is ensured that each data signal line 02 is always located on a side of the touch control signal line 03 away from the pixel electrodes 01 connected to the each data signal line 02, and thus a distance between the data signal line 02 and the adjacent pixel electrode 01 is increased, thereby greatly decreasing a coupling capacitance $C_{pd}$ between the data signal line 02 and the adjacent pixel electrode 01, reducing probability of occurrence of a poor picture display and thus improving picture display quality.

In the array substrate according to the embodiments of the present disclosure, each data signal line 02 is set to be always located on a side of the touch control signal line 03 away from the pixel electrodes 01 connected to the each data signal line 02. Thereby, the distance between the each data signal line 02 and the adjacent pixel electrode 01 can be in a range that is greater than 0 and less than or equal to 15 μm.

In the existing array substrate, as shown in FIG. 1, one data signal line 02 is spaced from the pixel electrodes 01 on both sides of the one data signal line 02 by different distances. Specifically, one data signal line 02 is closer to adjacent one (on a left side of the data signal line 02 in FIG. 1) of the pixel electrodes 01, and is farther from the other pixel electrode 01 (on a right side of the data signal line 02 in FIG. 1) connected to the one data signal line 02, thereby resulting in great difference in coupling capacitance $C_{pd}$, and thus also causing a poor picture display and adversely affecting picture display quality.

In the array substrate according to the embodiments of the present disclosure, as shown in FIG. 2 to FIG. 6, distances between the data signal lines 02 and the pixel electrodes 01 respectively connected to the data signal lines 02 are equal to one another.

Specifically, the distances between the data signal lines 02 and the pixel electrodes 01 respectively connected to the data signal lines 02 are set to be the same. Accordingly, it can be ensured that there is the same coupling capacitance $C_{pd}$ between each of the data signal lines 02 and a proximate column of pixel electrodes 01 (generally which are the pixel electrodes 01 connected to the each data signal line 02), alleviating a poor picture display caused by a difference of the coupling capacitances $C_{pd}$ between the different data signal lines 02 and the pixel electrodes 01, and thus improving picture display quality.

In the array substrate according to the embodiments of the present disclosure, as shown in FIG. 2 to FIG. 6, every two adjacent pixel electrodes 01 in the row direction serve as the electrode set 011. The data signal line 02 is located in a gap between the adjacent electrode sets 011 in a column direction. It can be appreciated that the data signal lines 02 are disposed only in the gaps between alternate ones of the pixel electrodes 01 in each row.

Figure 2:
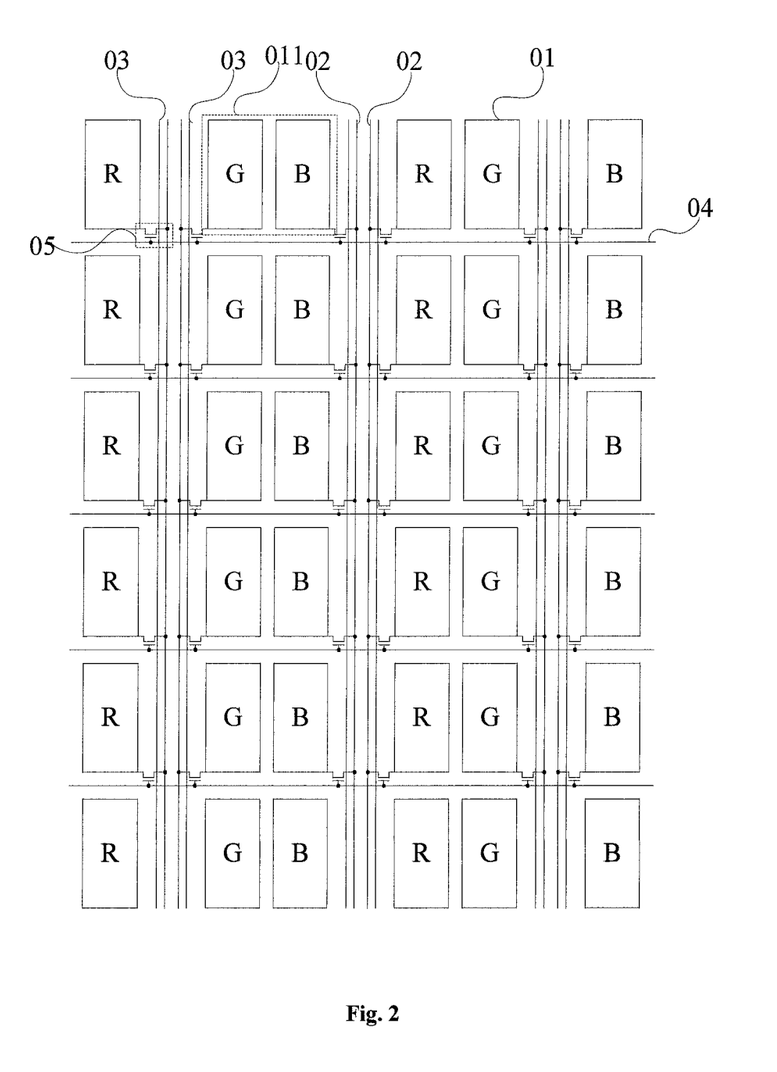
FIG. 2 is a schematic diagram showing a structure of an array substrate according to an embodiment of the present disclosure.
Figure 3:
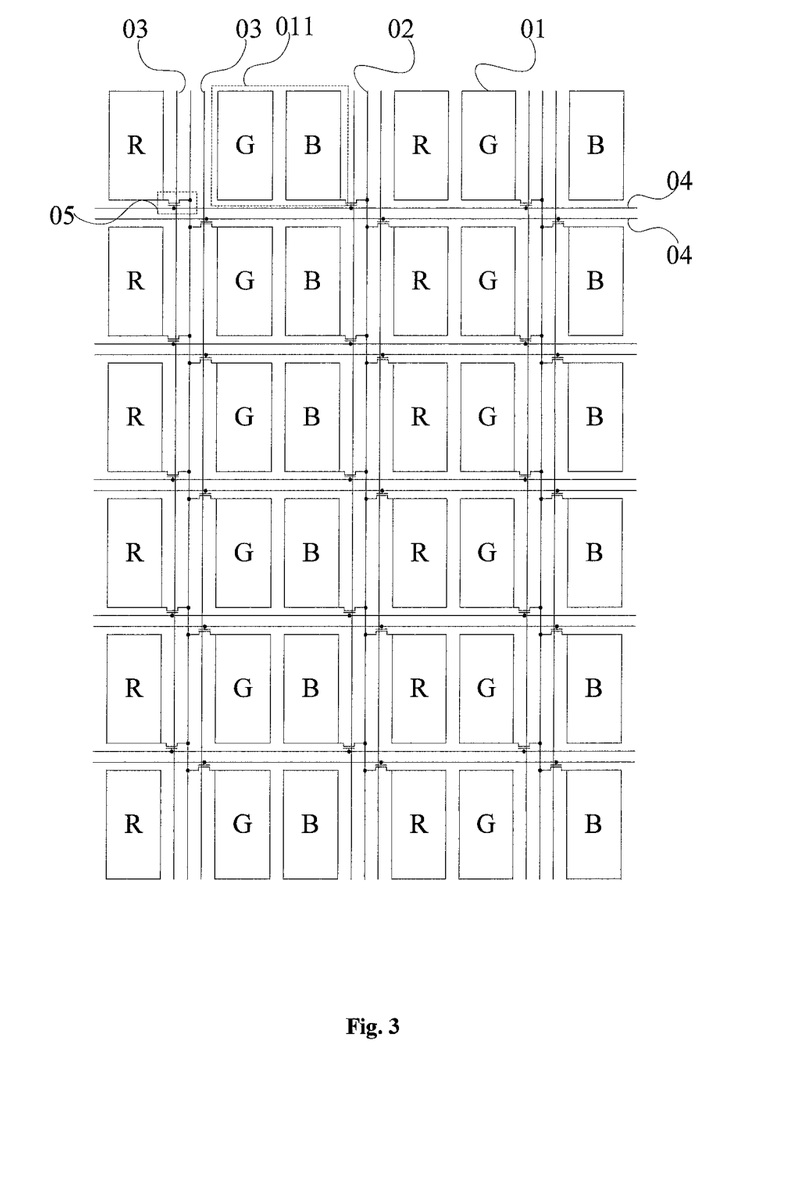
FIG. 3 is a schematic diagram showing a structure of an array substrate according to another embodiment of the present disclosure.
Figure 4:
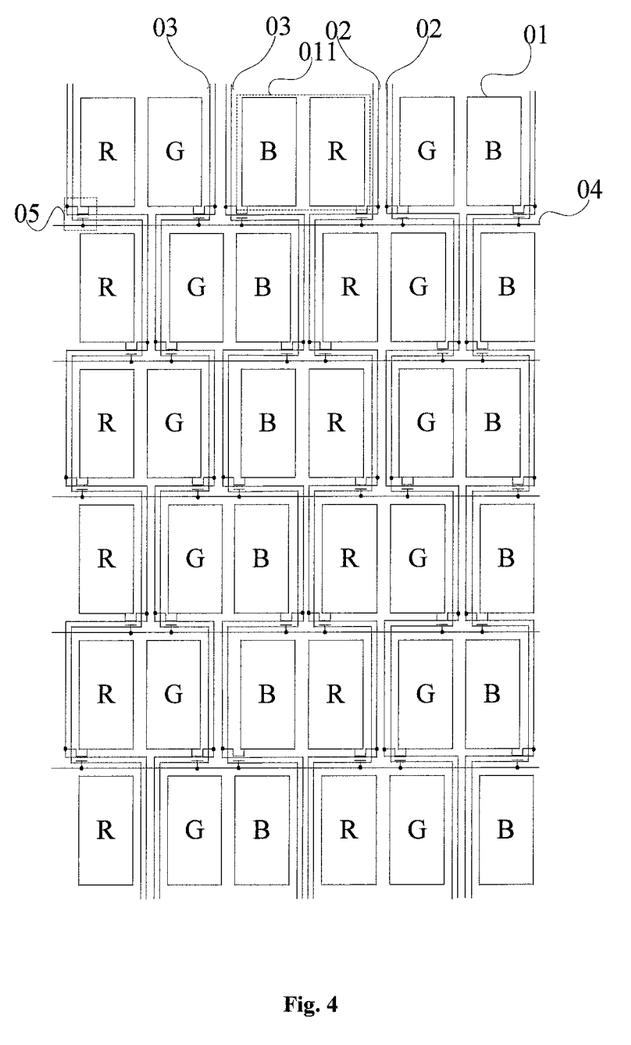
FIG. 4 is a schematic diagram showing a structure of an array substrate according to still another embodiment of the present disclosure.
Figure 5:
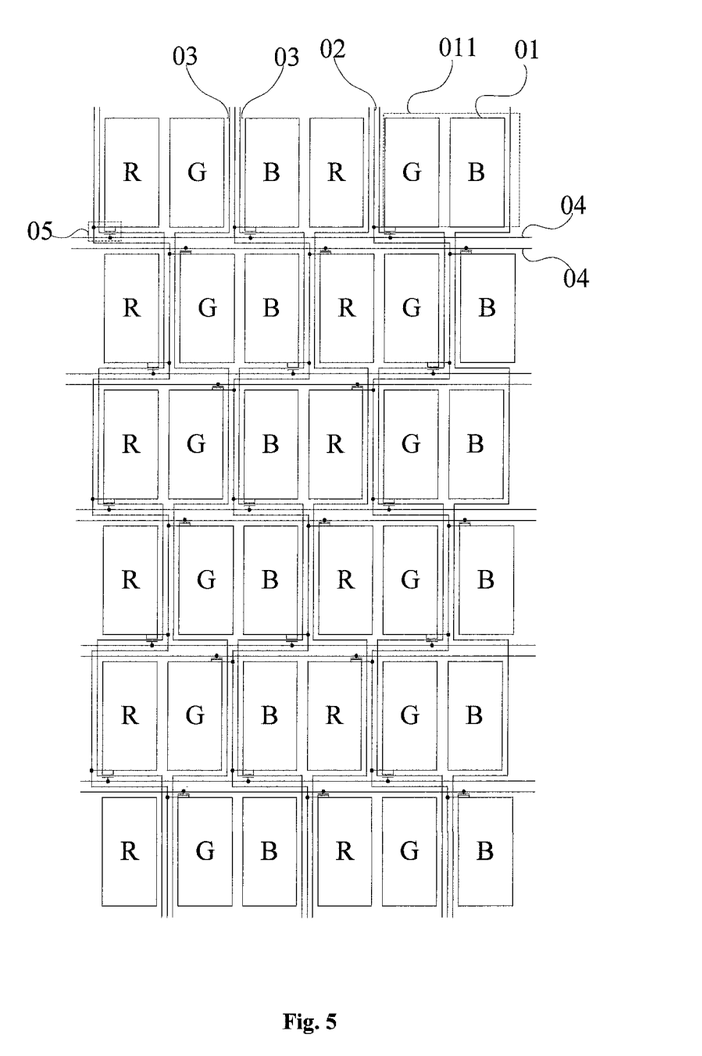
FIG. 5 is a schematic diagram showing a structure of an array substrate according to yet another embodiment of the present disclosure.
Figure 6:
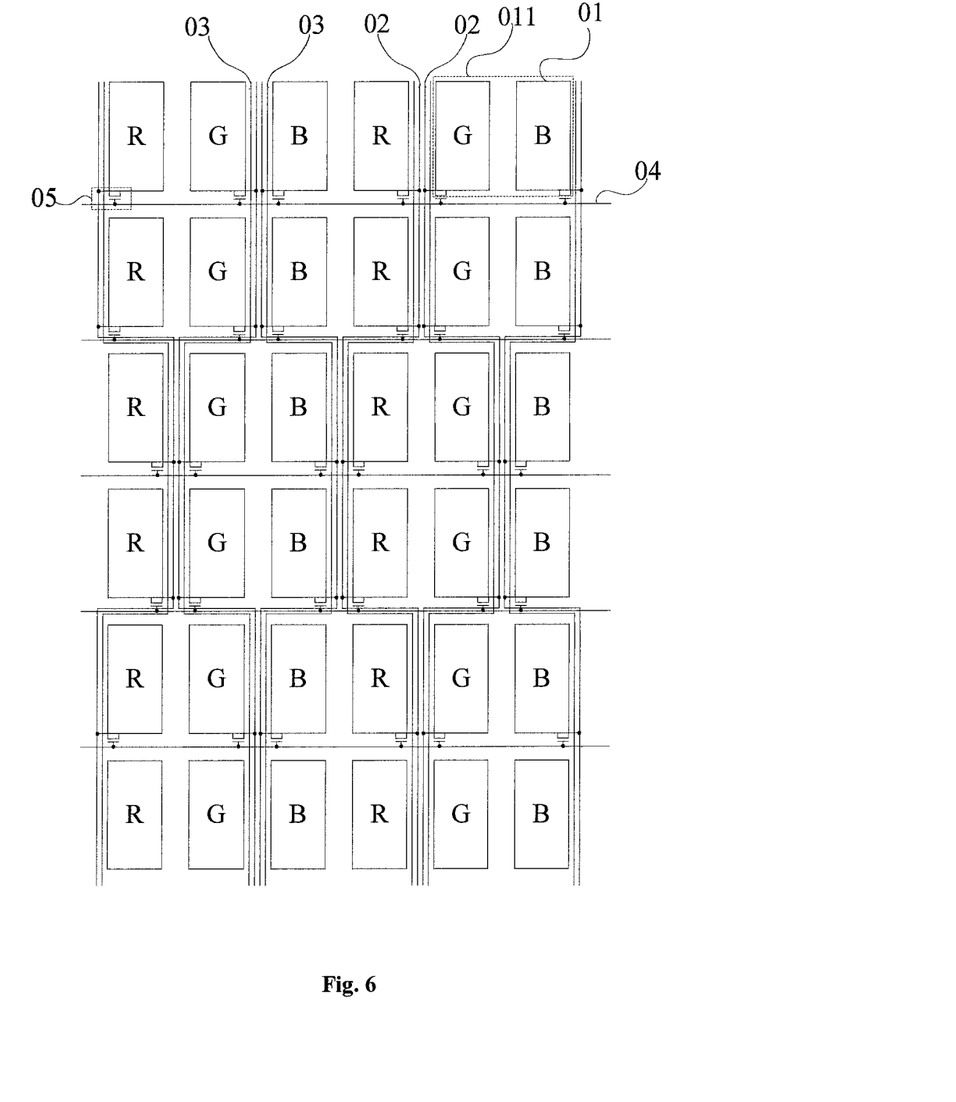
FIG. 6 is a schematic diagram showing a structure of an array substrate according to a further embodiment of the present disclosure.

In some embodiments, as shown in FIG. 2 and FIG. 3, the data signal lines 02 may be disposed only in odd-numbered ones of gaps between the pixel electrodes in each row in the column direction, and no data signal lines 02 are disposed in even-numbered ones of gaps between the pixel electrodes in the column direction. In this case, the electrode sets 011 may be regarded as being aligned with one another in the column direction. In other embodiments, as shown in FIG. 4 to FIG. 5, the data signal lines 02 may be disposed only in even-numbered ones of gaps between the pixel electrodes in each odd-numbered row in the column direction, and no data signal lines 02 are disposed in odd-numbered ones of gaps between the pixel electrodes in each odd-numbered row in the column direction; and the data signal lines 02 may be disposed only in odd-numbered ones of gaps between the pixel electrodes in each even-numbered row in the column direction, and no data signal lines 02 are disposed in even-numbered ones of gaps between the pixel electrodes in each even-numbered row in the column direction. In this case, the rows of electrode sets 011 may be regarded as being staggered from one another in the column direction. In some further embodiments, as shown in FIG. 6, the data signal lines 02 may be disposed only in even-numbered gaps of gaps between the pixel electrodes in first, second, fifth and sixth rows in the column direction, and no data signal lines 02 are disposed in odd-numbered gaps of gaps between the pixel electrodes in the first, second, fifth and sixth rows in the column direction; and the data signal lines 02 may be disposed only in odd-numbered ones of gaps between the pixel electrodes in third and fourth rows in the column direction, and no data signal lines 02 are disposed in even-numbered gaps of gaps between the pixel electrodes in the third and fourth rows in the column direction. In this case, every two rows of electrode sets 011 may be regarded as being staggered from another two rows of electrode sets 011 in the column direction. In addition, in ones, where no data signal lines 02 are disposed, of the gaps between the pixel electrodes in the column direction, other signal lines, for example the touch control signal lines 03, detection signal lines, or the like, may also be disposed according to actual requirements. There is no limitation on the other signal lines herein.

In the array substrate according to the embodiments of the present disclosure, one, where the data signal line is disposed, of the gaps between the adjacent pixel electrodes in the column direction has a greater width than that of other one, where no data signal line is disposed, of the gaps between the adjacent pixel electrodes in the column direction. As shown in FIG. 2 to FIG. 5, one (for example a gap between the adjacent electrode sets 011), where the data signal line 02 is disposed, of the gaps between the adjacent pixel electrodes in the column direction has a greater width than that of other one (for example a gap between the adjacent pixel electrodes in one electrode set 011), where no data signal line 02 is disposed, of the gaps between the adjacent pixel electrodes in the column direction.

Specifically, the width of one, where no data signal line 02 is disposed, of the gaps between the adjacent pixel electrodes in the column direction is reduced as far as possible, so that a usable area of the pixel electrode 01 can be increased, thereby raising an aperture ratio of a pixel. Of course, in specific application, as shown in FIG. 6, the widths of the gaps between the pixel electrodes in the column direction may also be set to be the same. There is no limitation on the widths of the gaps herein.

In the array substrate according to the embodiments of the present disclosure, as shown in FIG. 4 and FIG. 5, in the case where one, where the data signal line 02 is disposed, of the gaps in the column direction has a greater width than that of other one, where no data signal line is disposed, of the gaps in the column direction, it may be designed that the adjacent pixel electrodes 01 are staggered one another in the column direction by a distance that is equal to a factor "X" multiplied by a width of the pixel electrode and the factor "X" is larger than zero and less than one. In other words, the pixel electrodes 01 are not aligned with one another in the column direction. In this way, visual effect caused by a difference in the widths of the gaps between the pixel electrodes in the column direction can be alleviated.

In the array substrate according to the embodiments of the present disclosure, as shown in FIG. 2 and FIG. 3, the data signal lines 02 and the touch control signal lines 03 may extend in a straight line manner along the gaps between the electrode sets.

Specifically, when the data signal lines 02 and the touch control signal lines 03 extend in a straight line manner along the gaps between the electrode sets, it can be ensured that the data signal lines 02 and the touch control signal lines 03 have minimal wiring lengths, facilitating wiring design. However, no data signal lines 02 are disposed in the gaps between the adjacent pixel electrodes 01 in the electrode sets. Generally, since one, where the data signal line 02 is disposed, of the gaps between the adjacent pixel electrodes in the column direction has a greater width than that of other one, where no data signal line 02 is disposed, of the gaps between the adjacent pixel electrodes in the column direction, visual effect of picture display is adversely affected by nonuniformity of adjacent gaps along whole columns on the entire array substrate.

In the array substrate according to the embodiments of the present disclosure, as shown in FIG. 4 and FIG. 5, the data signal lines 02 and the touch control signal lines 03 may extend in a zigzag manner along the gaps between the electrode sets.

Specifically, when the data signal lines 02 and the touch control signal lines 03 extend in a zigzag manner along the gaps between the electrode sets, as shown in the figure, the data signal lines 02 and the touch control signal lines 03 may be regarded as having a layout of "zigzag" shape. In this way, arrangement of pixels can be optimized and visual effect caused by a difference in the widths of the gaps between the pixel electrodes in the column direction can be alleviated.

In the array substrate according to the embodiments of the present disclosure, as shown in FIG. 4 and FIG. 5, in every two adjacent rows of pixel electrodes, ones, where the data signal lines 02 are disposed, of the gaps between the pixel electrodes in the column direction have different positions. For example, the data signal lines 02 are disposed in even-numbered ones of gaps between the pixel electrodes in each odd-numbered row in the column direction, and no data signal lines 02 are disposed in odd-numbered ones of gaps between the pixel electrodes in each odd-numbered row in the column direction; and the data signal lines 02 are disposed in odd-numbered ones of gaps between the pixel electrodes in each even-numbered row in the column direction, and no data signal lines 02 are disposed in even-numbered ones of gaps between the pixel electrodes in each even-numbered row in the column direction. In other words, each data signal line 02 extending in the column direction is zigzagged between adjacent rows of pixel electrodes 01. Rows of electrode sets 011 may be regarded as being arranged to be staggered one another in the column direction by a distance that is less than a width of one pixel electrode.

Of course, each data signal line 02 extending in the column direction may also be bent at any row of pixel electrodes 01. For example, as shown in FIG. 6, each data signal line 02 may be zigzagged at every two rows of pixel electrodes 01. There is no limitation on where the data signal lines are zigzagged herein.

In the array substrate according to the embodiments of the present disclosure, the data signal line 02 and the touch control signal line 03 are respectively located in different layers of films to ensure that no short circuit will occur at crossing positions between the data signal lines 02 and the touch control signal lines 03.

In the array substrate according to the embodiments of the present disclosure, as shown in FIG. 2 and FIG. 4, each data signal line 02 is connected to the same column of pixel electrodes 01. In other words, the data signal lines 02 are in a one-to-one correspondence with these columns of the pixel electrodes 01. In this case, generally, the array substrate has a single-gate structure. In other words, one row of pixel electrodes 01 are connected to one gate line 04 through corresponding switching transistors 05.

Specifically, when the data signal lines 02 and the touch control signal lines 03 extend in a straight line manner along the gaps between the electrode sets, as shown in FIG. 2, each data signal line 02 is located on one side of the column of pixel electrodes 01 connected to it. When the data signal lines 02 and the touch control signal lines 03 extend in a zigzag manner along the gaps between the electrode sets, as shown in FIG. 4, the data signal lines 02 are located on both sides of the column of pixel electrodes 01 connected to them, respectively.

In the array substrate according to the embodiments of the present disclosure, when the array substrate has a single-gate structure, the data signal lines 02 may be in a one-to-one correspondence with the touch control signal lines 03.

Specifically, as shown in FIG. 2 and FIG. 4, the touch control signal line 03 is disposed only between each data signal line 02 and the pixel electrodes 01 connected to the each data signal line 02, and no touch control signal line 03 is disposed in one, where no data signal line 02 is disposed, of the gaps between the pixel electrodes in the column direction. Accordingly, it is ensured that one, where no data signal line 02 is disposed, of the gaps between the pixel electrodes in the column direction can have a minimal width. In this way, an aperture ratio of a pixel can be increased as far as possible.

In the array substrate according to the embodiments of the present disclosure, as shown in FIG. 3 and FIG. 5, the array substrate may also have a dual-gate structure. In other words, one row of pixel electrodes 01 are connected to two gate lines 04 through corresponding switching transistors 05, respectively. In this way, half of the data signal lines 02 can be saved, thereby facilitating raising of an aperture ratio. In this case, each data signal line 02 is connected to two columns of pixel electrodes 01 adjacent to it, respectively.

In the array substrate according to the embodiments of the present disclosure, as shown in FIG. 3 and FIG. 5, one data signal line 02 corresponds to two touch control signal lines 03.

Specifically, as shown in FIG. 3 and FIG. 5, the touch control signal line 03 is disposed only between each data signal line 02 and the pixel electrodes 01 connected to the each data signal line 02, and no touch control signal line 03 is disposed in one, where no data signal line 02 is disposed, of the gaps between the pixel electrodes in the column direction. Accordingly, it is ensured that one, where no data signal line 02 is disposed, of the gaps between the pixel electrodes in the column direction can have a minimal width. In this way, an aperture ratio of a pixel can be increased as far as possible.

Based on the same inventive concept, embodiments of the present disclosure also provide a liquid crystal display panel comprising the array substrate according to the embodiments of the present disclosure. Since principles of the liquid crystal display panel for solving a problem are similar to those of the array substrate, implementations of the array substrate may be referred to for implementations of the liquid crystal display panel, and repeated contents are no longer described for the sake of brevity.

Based on the same inventive concept, embodiments of the present disclosure also provide a display apparatus comprising the liquid crystal display panel according to the embodiments of the present disclosure. The display apparatus may comprise any products or parts having a displaying function, such as a mobile phone, a tablet computer, a TV, a display, a notebook computer, a digital frame, and a navigator, and the likes. The embodiments of the liquid crystal display panel may be referred to for implementations of the display apparatus and repeated contents are no longer described for the sake of brevity.

The embodiments of the present disclosure provide the array substrate, the liquid crystal display panel, and the display apparatus. The array substrate comprises: a plurality of pixel electrodes arranged in an array, data signal lines each connected to a corresponding one of the pixel electrodes, and touch control signal lines extending in the same direction as the data signal lines. Every two ones of the pixel electrodes adjacent to each other in a row direction constitute an electrode set. Each of the data signal lines is located in a gap between two adjacent electrode sets in a column direction, and the touch control signal lines are each disposed between one of the data signal lines and either of two electrode sets located adjacent to the one data signal line in the row direction. The touch control signal line is disposed between the data signal line and each of the pixel electrodes located on both sides of the data signal line. Accordingly, it is ensured that the data signal line is always located on a side of the touch control signal line away from the pixel electrodes, and thus a distance between the data signal line and the adjacent pixel electrode is increased, thereby greatly decreasing a coupling capacitance between the data signal line and the pixel electrode, reducing probability of occurrence of a poor picture display and improving picture display quality.

Apparently, it will be understood by those skilled in the art that various changes, modifications, substitutions and alterations may be made without departing from the spirit and scope of the disclosure. Therefore, if the changes, modifications, substitutions and alterations of the present disclosure belong to the scope defined in the appended claims of the present disclosure and their equivalents, the present disclosure is intended to include the changes, modifications, substitutions and alterations.

What is claimed is:

1. An array substrate, comprising: a plurality of pixel electrodes arranged in an array, data signal lines each connected to a corresponding one of the pixel electrodes, and touch control signal lines extending in a same direction as the data signal lines; wherein:
   every two ones of the pixel electrodes adjacent to each other in a row direction constitute an electrode set, each of the data signal lines is located in a gap between two adjacent electrode sets in a column direction, and the touch control signal lines are each disposed between one of the data signal lines and either of two electrode sets located adjacent to the one data signal line in the row direction;
   one, where the data signal line is disposed, of the gaps between the adjacent pixel electrodes in the column direction has a greater width than that of other one, where no data signal line is disposed, of the gaps between the adjacent pixel electrodes in the column direction; and
   the adjacent pixel electrodes in the column direction are staggered one another by a distance that is equal to a factor "X" multiplied by a width of the pixel electrode and the factor "X" is larger than zero and less than one.

2. The array substrate of claim 1, wherein distances between the data signal lines and the pixel electrodes respectively connected to the data signal lines are equal to one another.

3. The array substrate of claim 1, wherein the data signal lines and the touch control signal lines extend in a zigzag manner along the gaps between the electrode sets.

4. The array substrate of claim 1, wherein the data signal line and the touch control signal line are located in different layers of films, respectively.

5. The array substrate of claim 1, wherein each of the data signal lines is connected to the pixel electrodes located in a same column.

6. The array substrate of claim 5, wherein the array substrate has a single-gate structure, and the data signal lines are in a one-to-one correspondence with the touch control signal lines.

7. The array substrate of claim 1, wherein the array substrate has a dual-gate structure, and each of the data signal lines is connected to two columns of pixel electrodes adjacent to the each data signal line, respectively.

8. The array substrate of claim 7, wherein each of the data signal lines corresponds to two of the touch control signal lines, respectively.

9. A liquid crystal display panel comprising the array substrate of claim 1, wherein, in the array substrate, one, where the data signal line is disposed, of the gaps between the adjacent pixel electrodes in the column direction has a greater width than that of other one, where no data signal line is disposed, of the gaps between the adjacent pixel electrodes in the column direction; the adjacent pixel electrodes in the column direction are staggered one another by a distance that is equal to a factor "X" multiplied by a width of the pixel electrode and the factor "X" is larger than zero and less than one.

10. The liquid crystal display panel of claim 9, wherein in the array substrate, distances between the data signal lines and the pixel electrodes respectively connected to the data signal lines are equal to one another.

11. The liquid crystal display panel of claim 9, wherein in the array substrate, the data signal lines and the touch control signal lines extend in a zigzag manner along the gaps between the electrode sets.

12. The liquid crystal display panel of claim 9, wherein each of data signal lines is connected to the pixel electrodes in a same column; and the array substrate has a single-gate structure, and the data signal lines are in a one-to-one correspondence with the touch control signal lines.

13. The liquid crystal display panel of claim 9, wherein the array substrate has a dual-gate structure, each of the data signal lines is connected to two columns of pixel electrodes adjacent to the each data signal line, respectively, and each of the data signal lines corresponds to two of the touch control signal lines, respectively.

14. A display apparatus comprising the liquid crystal display panel of claim 9.

* * * * *